(12) United States Patent
Takei et al.

(10) Patent No.: US 12,495,614 B2
(45) Date of Patent: Dec. 9, 2025

(54) STABILIZING DIELECTRIC STRESS IN A GALVANIC ISOLATION DEVICE

(71) Applicant: Texas Instruments Incorporated, Dallas, TX (US)

(72) Inventors: Yoshihiro Takei, Ushiku (JP); Mitsuhiro Sugimoto, Tsukuba (JP); Byron Lovell Williams, Plano, TX (US); Jeffrey Alan West, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 444 days.

(21) Appl. No.: 18/067,703

(22) Filed: Dec. 17, 2022

(65) Prior Publication Data

US 2024/0113095 A1  Apr. 4, 2024

Related U.S. Application Data (60) Provisional application No. 63/411,934, filed on Sep. 30, 2022.

(51) Int. Cl.
| | |
|---|---|
| *H01L 23/31* | (2006.01) |
| *H01L 21/02* | (2006.01) |
| *H01L 23/00* | (2006.01) |
| *H10D 86/85* | (2025.01) |

(52) U.S. Cl.
CPC ......... *H10D 86/85* (2025.01); *H01L 21/0214* (2013.01); *H01L 21/02247* (2013.01); *H01L 21/02252* (2013.01); *H01L 23/3157* (2013.01); *H01L 24/05* (2013.01); *H01L 24/06* (2013.01); *H01L 2224/05567* (2013.01); *H01L 2224/06102* (2013.01)

(58) Field of Classification Search
None
See application file for complete search history.

(56) References Cited

U.S. PATENT DOCUMENTS

| | | | |
|---|---|---|---|
| 2014/0145301 A1* | 5/2014 | Moghe | H10D 89/921 257/532 |
| 2017/0263696 A1* | 9/2017 | West | H10D 1/00 |
| 2018/0269272 A1* | 9/2018 | Cook | H01L 23/49575 |
| 2020/0312794 A1* | 10/2020 | West | H01L 23/645 |

* cited by examiner

*Primary Examiner* — Benjamin P Sandvik
(74) *Attorney, Agent, or Firm* — Xiaotun Qiu; Frank D. Cimino (57) ABSTRACT

A microelectronic device including an isolation device with a stabilized dielectric. The isolation device includes a lower isolation element, an upper isolation element, and an inorganic dielectric plateau between the lower isolation element and the upper isolation element. The dielectric sidewall of the inorganic dielectric plateau is stabilized in a nitrogen containing plasma which forms a $SiO_xN_y$ surface on the dielectric sidewall of the inorganic dielectric plateau. The $SiO_xN_y$ surface on the dielectric sidewall of the inorganic dielectric plateau reduces ingress of moisture into the dielectric stack of the inorganic dielectric plateau.

20 Claims, 11 Drawing Sheets

STABILIZING DIELECTRIC STRESS IN A GALVANIC ISOLATION DEVICE

CROSS REFERENCE TO RELATED APPLICATIONS

This application is related to U.S. Provisional Patent Application No. 63/411,934, filed on 30 Sep. 2022 and hereby incorporated herein by reference in its entirety.

FIELD

This disclosure relates to the field of microelectronic devices. More particularly, but not exclusively, this disclosure relates to stabilizing dielectric stress in microelectronic devices.

BACKGROUND

Galvanic isolation is a principle of isolating functional sections of electrical systems to prevent current flow while energy or information can still be exchanged between sections by other means, such as capacitance, induction, electromagnetic waves, optical, acoustic, or mechanical means. Galvanic isolation is typically used where two or more electric circuits communicate, but their grounds or reference nodes may be at different potentials. It is an effective method of breaking ground loops by preventing unwanted current from flowing between two units sharing a reference conductor. Galvanic isolation is also used for safety as a means of preventing accidental current from reaching ground through a person's body.

Isolators are devices designed to minimize direct current and unwanted transient currents between two systems or circuits while allowing data and power transmission between the two. In most applications, isolators also act as a barrier to high voltage in addition to allowing the system to function properly. Dielectric material is commonly used to isolate elements in isolators. Dielectric breakdown is a key concern, especially in high voltage applications. The dielectric material between the isolator elements may be subject to degradation due to moisture ingress.

SUMMARY

The following presents a simplified summary in order to provide a basic understanding of one or more aspects of the present patent disclosure. The summary is not an extensive overview of the disclosure and is not intended to identify key or critical elements of the disclosure, nor is it to delineate the scope thereof. Rather, the primary purpose of the summary is to present some concepts of the disclosure in a simplified form as a prelude to a more detailed description that is present later.

Embodiments of a microelectronic device including a galvanic isolation device hereafter referred to as isolation device are disclosed. The isolation device includes a lower isolation element hereafter referred to as the lower metal coil, an upper isolation element hereafter referred to as the upper metal coil, and a reinforced galvanic isolation device inorganic dielectric stack hereafter referred to as the plateau between the lower metal coil and the upper metal coil. The plateau contains a moisture barrier over the plateau of silicon nitride, silicon oxynitride herein referred to as $SiO_xN_y$ (where x and y can be from 0 to 1 inclusive). The plateau contains a sidewall moisture barrier of silicon $SiO_xN_y$ which is formed by an ammonia plasma treatment or pretreatment with another nitrogen containing precursor (herein referred to as a nitrogen containing plasma). The plateau may contain alternating layers of high stress and low stress silicon dioxide. Alternating layers of high stress silicon dioxide and low stress silicon dioxide may provide a means of reinforcement of the plateau which improves resistance to cracking of the plateau. Other dielectric stacks are within the scope of this disclosure.

Additionally, an embodiment of a microelectronic device including an active element such as a transistor and associated interconnect system is shown. The microelectronic device includes a sidewall on the dielectric of the interconnect system containing a sidewall moisture barrier of $SiO_xN_y$ which is formed by a nitrogen containing plasma treatment.

BRIEF DESCRIPTION OF THE VIEWS OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to affect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following detailed description taken in connection with the appended claims and with reference to the attached drawing Figures in which:

DETAILED DESCRIPTION

The following co-pending patent applications have related subject matter and are hereby incorporated by reference: U.S. patent application Ser. No. 17/957,847, titled "GALVANIC ISOLATION DEVICE", by West, et al.), Filed Sep. 30, 2022, and U.S. patent application Ser. No. 17/958, 040, titled "SINGLE DIE REINFORCED GALVANIC ISOLATION DEVICE", by West, et al.), Filed Sep. 30, 2022. With their mention in this section, these patent applications are not admitted to be prior art with respect to the present invention.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

Example microelectronic devices described below may include or be formed of a semiconductor material like Silicon (Si), Silicon Carbide (SiC), Silicon Germanium (SiGe), Gallium Arsenide (GaAs) or an organic semiconductor material. The semiconductor material may be embodied as a semiconductor wafer. The microelectronic devices include one or more galvanic isolation devices. The microelectronic devices may also include one or more semiconductor component or components such as metal oxide semiconductor field effect transistors (MOSFETs), insulated gate bipolar transistors (IGBTs) gate drivers, input/output and control circuitry, as well as microprocessors, microcontrollers, and/or micro-electro-mechanical components or systems (MEMS). The microelectronic devices may be manifested as single chip devices or may be contained in multi-chip modules (MCMs). The semiconductor chip may further include inorganic and/or organic materials that are not semiconductor, for example, insulators such as inorganic dielectric materials or polymers, or conductors such as metals.

For the purposes of this disclosure, the term "high voltage" refers to operating potentials greater than 450 volts, and "low voltage" refers to operating potentials less than 100 volts. For example, a high voltage portion of the isolation device may operate at 450 volts to 1200 volts, while a low voltage portion of the isolation device may operate at 1.5 volts to 30 volts.

It is noted that terms such as top, bottom, front, back, over, above, under, and below may be used in this disclosure. These terms should not be construed as limiting the position or orientation of a structure or element, but should be used to provide spatial relationship between structures or elements.

For the purposes of this disclosure, the term "lateral" refers to a direction parallel to a plane of the instant top surface of the microelectronic device the term "vertical" is understood to refer to a direction perpendicular to the plane of the instant top surface of the microelectronic device.

For the purposes of this disclosure, the term "conductive" is to be interpreted as "electrically conductive". The term "conductive" refers to materials and structures capable of supporting a steady electrical current, that is, direct current (DC).

For the purposes of this disclosure, the "dielectric constant" of a material refers to a ratio of the material's (absolute) permittivity to the vacuum permittivity, at a frequency below 1 hertz (Hz). The vacuum permittivity has a value of approximately $8.85 \times 10^{-12}$ farads/meter (F/m).

For the purposes of this disclosure, unless otherwise noted, the term high stress silicon dioxide refers to a silicon dioxide film with a stress of between −150 MPa and −80 MPa and the term low stress silicon dioxide refers to a silicon dioxide film with a stress of between −60 MPa and −10 MPa. Additionally, a negative stress implies a compressive stress and a positive stress implies a tensile stress.

Figure 1A:
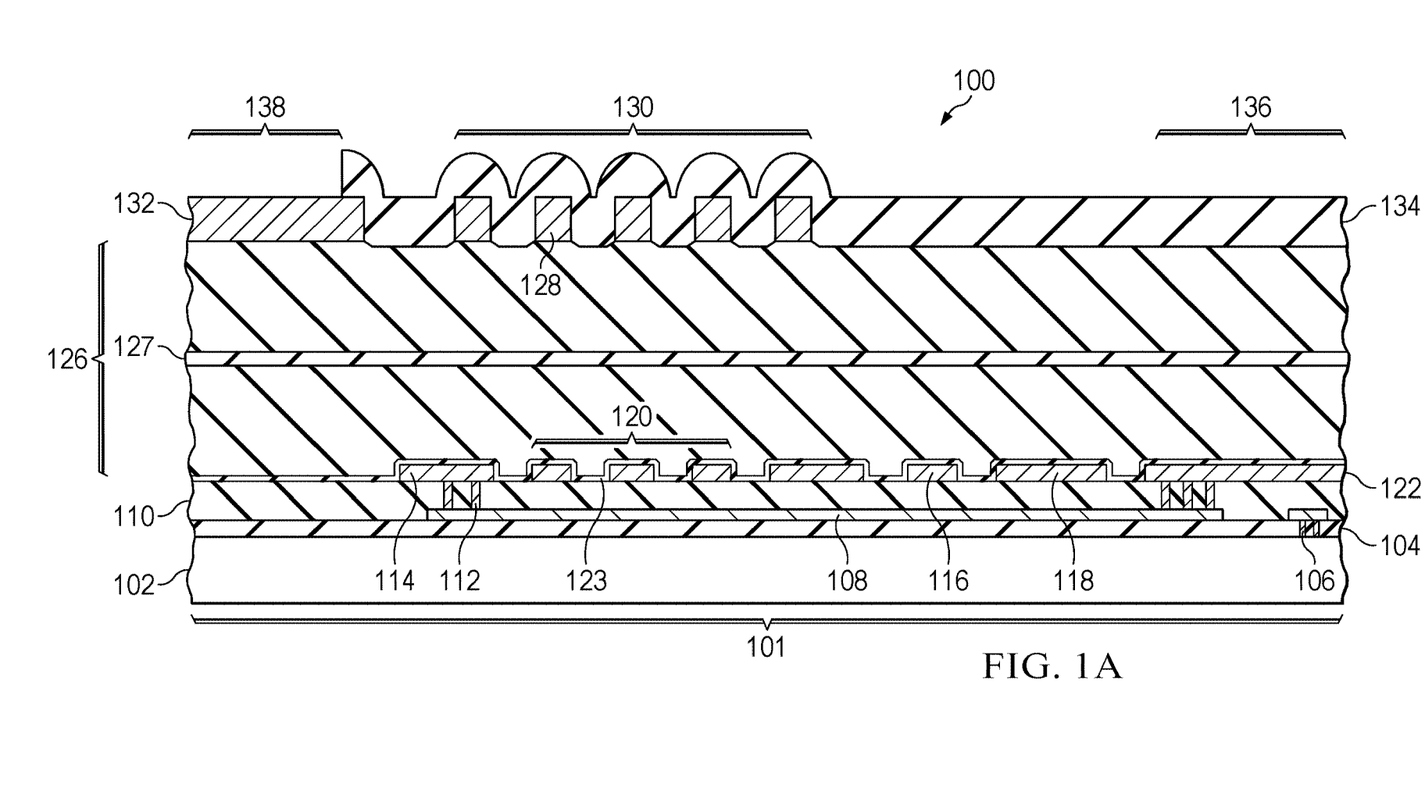
FIG. 1A through FIG. 1D are cross sections of an example microelectronic device with an isolation device containing a sidewall of $SiO_xN_y$, depicted in successive stages of an example method of formation.

FIG. 1A is a cross section of an example microelectronic device 100 a portion of an isolation device 101 after the formation of the protective overcoat 134 layer. The microelectronic device 100 may be implemented as part of a multi-chip array to provide galvanic isolation between a high voltage component and a low voltage component. The isolation device 101 of this example is a transformer, but could include a capacitor, a magnetic isolator, an optical isolator, a thermal isolator, or other elements which require galvanic isolation between high voltage and low voltage elements. The microelectronic device 100 is formed on a substrate 102, which may be part of a semiconductor wafer and may contain additional microelectronic devices. The substrate 102 includes a semiconductor material. The semiconductor material may include crystalline silicon, or may include another semiconductor material, such as silicon germanium, silicon carbide, gallium nitride, or gallium arsenide, by way of example.

A pre-metal dielectric (PMD) layer 104 is formed over the substrate 102. The PMD layer 104 includes one or more dielectric layers of silicon dioxide, phosphosilicate glass (PSG), fluorosilicate glass (FSG), borophosphosilicate glass (BPSG), organosilicate glass (OSG), low-k dielectric material, silicon nitride, silicon oxynitride, silicon carbide, silicon carbide nitride, or other dielectric materials. The PMD layer 104 may be formed by one or more dielectric deposition processes, such as a low-pressure chemical vapor deposition (LPCVD) process, a plasma enhanced chemical vapor deposition (PECVD) process, a high aspect ratio process (HARP) using ozone and tetraethyl orthosilicate (TEOS), high density plasma deposition (HDP), or an atmospheric pressure chemical vapor deposition (APCVD) process.

Contacts 106 of the first level interconnects 108 are formed through the PMD layer 104 to make electrical connections to the substrate 102. The contacts 106 are electrically conductive, and may include tungsten on a titanium adhesion layer and a titanium nitride liner. The contacts 106 may be formed by etching contact holes through the PMD layer 104, and forming the titanium adhesion layer by a physical vapor deposition (PVD) process. The titanium nitride liner may be formed on the titanium adhesion layer by an atomic layer deposition (ALD) process or chemical vapor deposition (CVD) process. The tungsten may be formed on the titanium nitride liner by a metalorganic chemical vapor deposition (MOCVD) process using tungsten hexafluoride reduced by silane and hydrogen. Tungsten, titanium nitride, and titanium on a top surface of the PMD layer 104, outside of the contacts 106, may be removed by a tungsten etch back process, a tungsten chemical mechanical polish (CMP) process, or both.

By way of example, the metallization of the isolation device 101 is described for an etched aluminum-based interconnect system. The isolation device 101 may also be formed using a copper-based interconnect system. First level interconnects 108 are formed on the PMD layer 104, making electrical connections to the contacts 106. The first level interconnects 108 are electrically conductive. The first level interconnects 108 may have an etched aluminum structure, and may include an adhesion layer, not shown, of titanium nitride or titanium tungsten, on the PMD layer 104, an aluminum layer, not specifically shown, with a few atomic percent of silicon, titanium, or copper, on the adhesion layer, and an anti-reflection layer, not specifically shown, of titanium nitride on the aluminum layer. An etch mask, not specifically shown, is formed followed by a reactive ion etch (RIE) process to etch the anti-reflection layer, the aluminum layer, and the adhesion layer where exposed by the etch mask, and subsequently removing the etch mask to form the first level interconnects 108.

A first interlevel dielectric (ILD) layer 110 which may include a single layer of dielectric or multiple dielectric layers may be formed on the first level interconnects 108. After the formation of the first ILD layer 110, first level vias 112 are formed in the first ILD layer 110, making electrical connection to the first level interconnects 108. The first level vias 112 may be formed by etching via holes through the first ILD layer 110, and forming a titanium adhesion layer by a physical vapor deposition (PVD) process. A titanium nitride liner may be formed on the titanium adhesion layer by an atomic layer deposition (ALD) process or chemical vapor deposition (CVD) process. Tungsten may be formed on the titanium nitride liner by a metalorganic chemical vapor deposition (MOCVD) process using tungsten hexafluoride reduced by silane and hydrogen. Tungsten, titanium nitride, and titanium on a top surface of the first level vias 112, outside of the via holes may be removed by a tungsten etch back process, a tungsten chemical mechanical polish (CMP) process, or both.

Second level interconnects 114 are formed on the first ILD layer 110 making electrical contact with the first level vias 112. The second level interconnects 114 are electrically conductive. The second level interconnects 114 may have an etched aluminum structure, and may include an adhesion layer, not specifically shown, of titanium nitride or titanium tungsten, on the first ILD layer 110, an aluminum layer, not specifically shown, with a few atomic percent of silicon, titanium, or copper, on the adhesion layer, and an anti-reflection layer, not specifically shown, of titanium nitride on the aluminum layer. A second interconnects etch mask (not specifically shown), is formed followed by a reactive ion etch (RIE) process to etch the anti-reflection layer, the aluminum layer, and the adhesion layer where exposed by the etch mask, and subsequently removing the etch mask to form the second level interconnects 114. In this example, a lower metal coil 120 of the isolation device 101 may be formed in the second level interconnects 114 but may be formed at other levels. A ground ring 116 (grounding outside of the plane of the cross section of FIG. 1A) for the isolation device 101 is also formed in the second level interconnects 114. Grounded second level interconnects filler metal 118 (grounding outside of the plane of the cross section of FIG. 1A) may also be formed in the second level interconnects). A lower bond pad 122 may also be formed in the second level interconnects 114.

A dielectric stack 126 is deposited on the second level interconnects 114 which forms subsequently forms a plateau 152 (shown in FIG. 1E) of the isolation device 101 between the lower metal coil 120 and the upper metal coil 130. The dielectric layers composing the dielectric stack 126 may singly or in combination be composed of low stress silicon dioxide, high stress silicon dioxide, high density plasma (HDP) silicon dioxide, silicon oxynitride, and silicon nitride. The low stress silicon dioxide may have a stress between −60 MPa and −10 MPa. The high stress silicon dioxide may have a stress between −150 MPa and −80 MPa. The HDP silicon dioxide may have a stress between −120 MPa and −90 MPa. The silicon oxynitride may have a stress between −120 MP and 0 MPa. The silicon nitride may have a stress between −1 GPa and −100 MPa. The dielectric stack may also contain an etch stop layer 123 of silicon nitride or silicon oxynitride over the lower metal coil 120 and the lower bond pad 122. The dielectric stack may also contain an etch stop layer 127 of silicon nitride or silicon oxynitride within the dielectric stack.

Top metal interconnects 128 are formed on the dielectric stack 126. The top metal interconnects 128 may have an etched aluminum structure, and may include an adhesion layer, not specifically shown, of titanium nitride or titanium tungsten, upper, an aluminum layer, not specifically shown, with a few atomic percent of silicon, titanium, or copper, on the adhesion layer, and an anti-reflection layer, not specifically shown, of titanium nitride on the aluminum layer. A top metal interconnects photolithography mask (not specifically shown) is formed followed by a reactive ion etch (RIE) process to etch the anti-reflection layer, the aluminum layer, and the adhesion layer where exposed by the etch mask. The RIE used to etch the top metal interconnects may remove up to 200 nm of the dielectric stack 126 in areas exposed to the RIE. Features of the top metal interconnects 128 shown include the upper metal coil 130 and the upper bond pad 132.

A protective overcoat 134 is formed over the top metal interconnects 128. The protective overcoat is formed by a deposition of silicon oxynitride, silicon nitride, or a combination thereof.

Figure 1B:
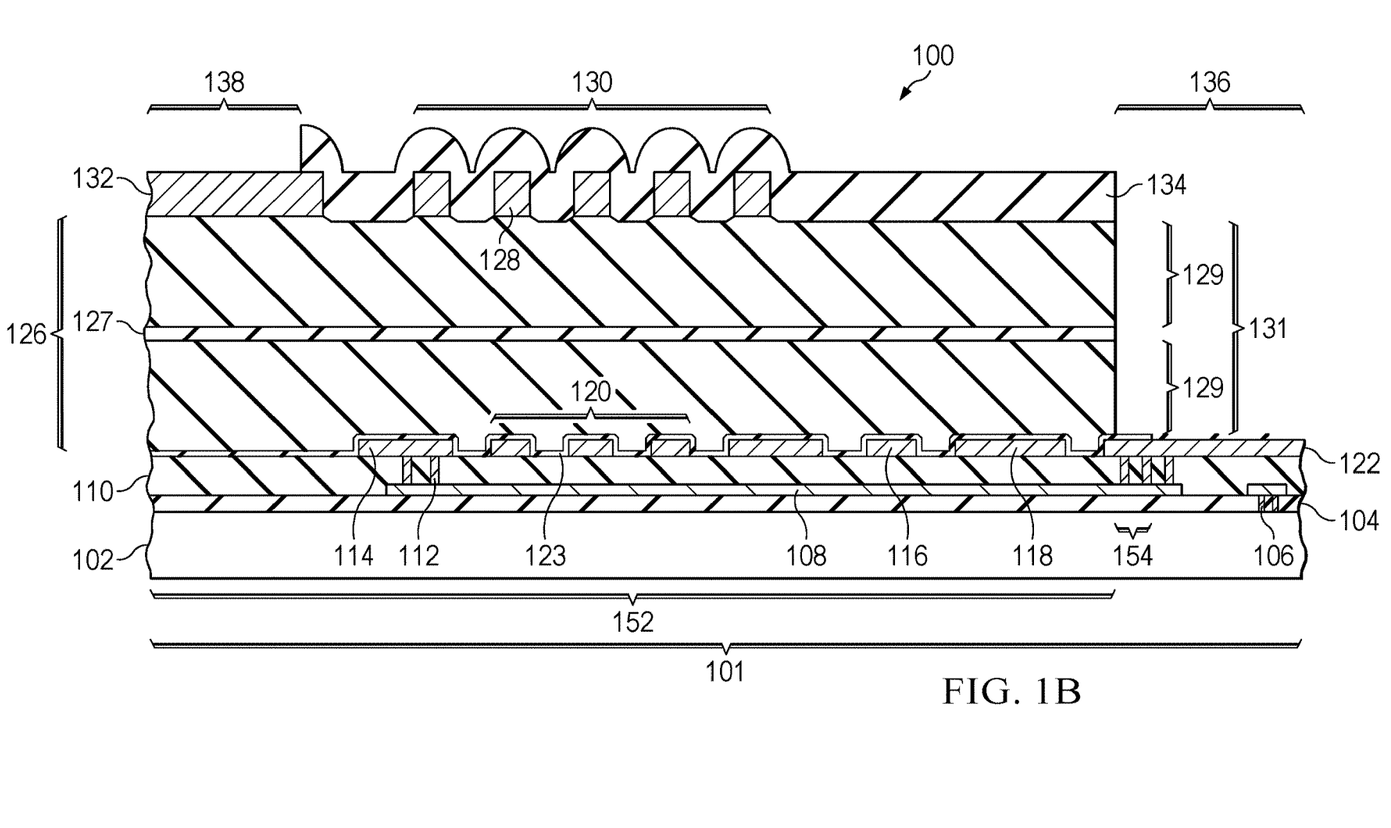

FIG. 1B shows the isolation device 101 after a series of etch steps (not specifically shown) have removed the protective overcoat 134 in the upper bond pad region 138 to expose the upper bond pad 132 as well as the protective overcoat and the dielectric stack in the lower bond pad region 136 to expose the lower bond pad 122. The etching of the dielectric stack 126 results in a vertical dielectric sidewall 131 of the plateau 152. The etch stop layer 123, may remain in areas outside the lower bond pad region 136 creating a plateau to bond pad space 154. The vertical dielectric sidewall 131 comprises silicon dioxide 129 and an etch stop layer 127. The vertical dielectric sidewall 131 of the silicon dioxide 129 provides a pathway for moisture ingress into the dielectric stack 126. The absorption of moisture through the dielectric stack 126 may result in cracking of the dielectric stack 126, or electrical isolation degradation of the dielectric stack 126 of the isolation device 101 during operation.

Figure 1C:
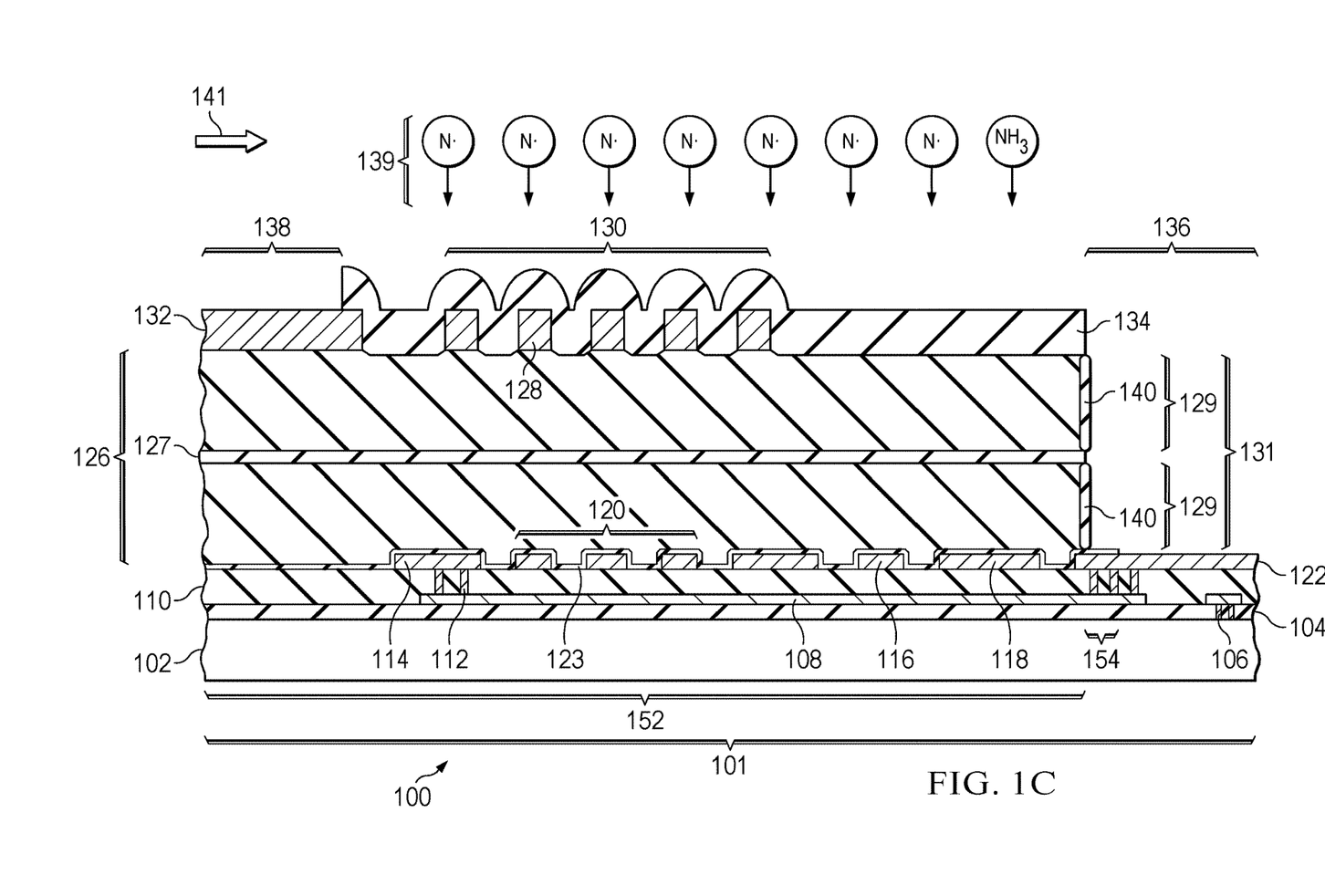

Referring to FIG. 1C, a nitrogen containing plasma 139 is used to form a vertical dielectric sidewall surface herein referred to as the $SiO_xN_y$ layer 140 on the surface of the silicon dioxide 129 of the vertical dielectric sidewall 131. The nitrogen containing plasma 139 dissociates the nitrogen containing source 141 into nitrogen radicals and hydrogen radicals. A typical nitrogen source to produce the nitrogen radicals may be ammonia, but dinitrogen or an organic species with a general formula $C_xH_yN_z$ (where x, y, and z may be from zero to one) may be used. Under appropriate wafer bias conditions, the nitrogen radicals can exchange with oxygen atoms bonded to silicon atoms on or near the surface of the exposed silicon dioxide 129 of the vertical dielectric sidewall 131 forming the $SiO_xN_y$ layer 140. The $SiO_xN_y$ layer 140 does not extend over the etch stop layer 127. The $SiO_xN_y$ layer 140 may be from 1 nm to greater than 10 nm based on the nitrogen containing plasma 139 formation conditions. The nitrogen containing plasma 139 is a surface treatment which reacts with the silicon dioxide of the vertical dielectric sidewall 131 of the silicon dioxide 129 and is not a CVD deposition. The stoichiometry of resulting $SiO_xN_y$ layer 140 is most nitrogen rich at the surface of the $SiO_xN_y$ layer 140 with the nitrogen concentration of the $SiO_xN_y$ layer 140 becoming lower farther from the surface of the $SiO_xN_y$ layer 140 layer. The nitrogen containing plasma 139 may be accomplished in an PECVD deposition chamber or plasma etch chamber by way of example. Nitrogen or another inert gas may be used as a carrier gas for the nitrogen containing source 141. The wafer temperature may be more than 200 C. The nitrogen containing plasma 139 treatment time may be greater than 10 seconds with a partial pressure of the nitrogen containing source 141 greater than 10 percent. The power of the plasma during the nitrogen containing plasma 139 treatment may be greater than 250 watts by way of example. An etch stop layer 127 exposed on the vertical dielectric sidewall 131, being nitrogen rich undergoes little or no additional nitridation on exposure to the nitrogen containing plasma 139.

Figure 1D:
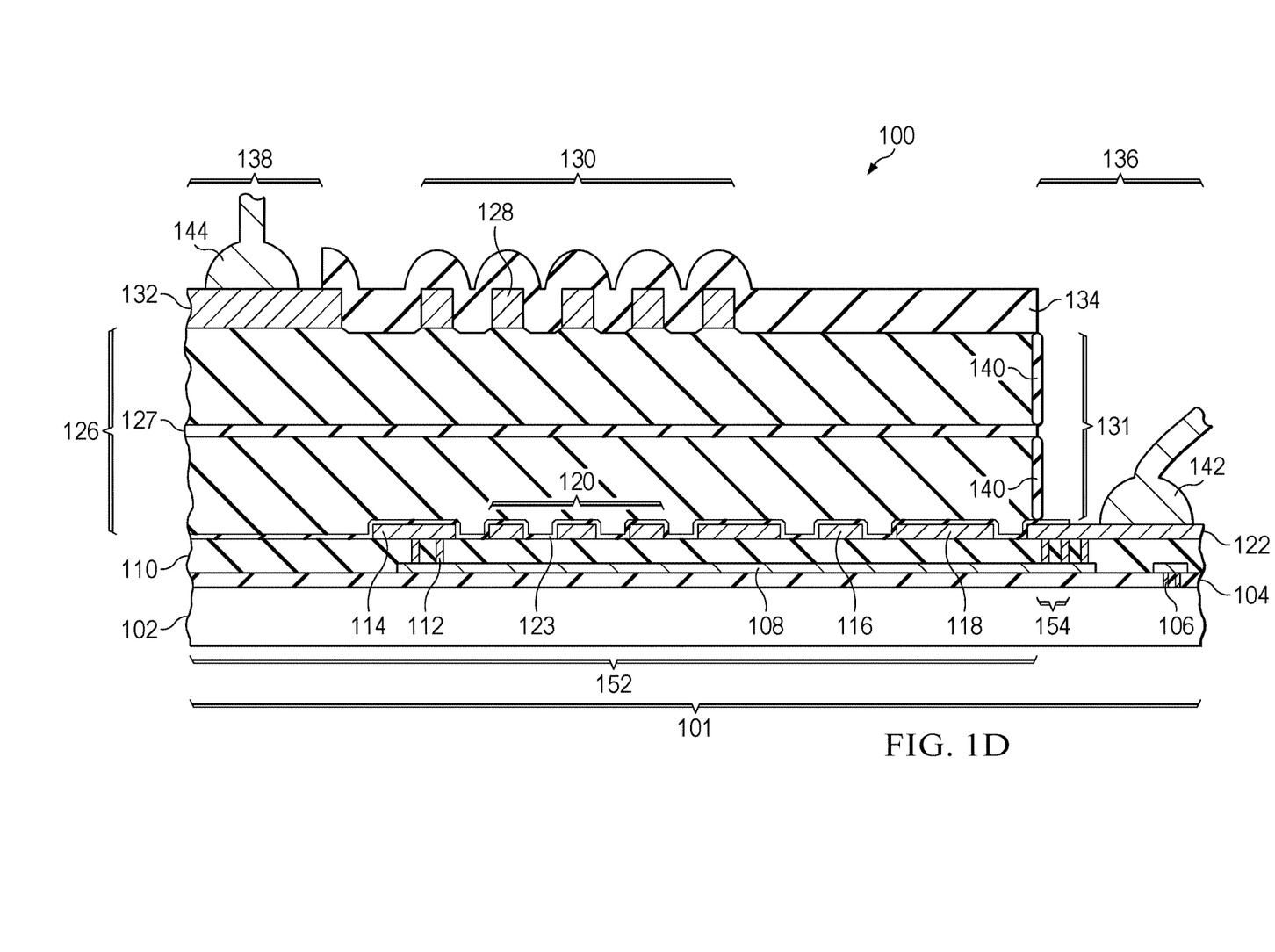

Referring to FIG. 1D, a cross section is shown after the formation of the upper ball bond 144 to the upper bond pad 132, and the formation of the lower ball bond 142 to the lower bond pad 122. The addition of the $SiO_xN_y$ layer 140 to the vertical dielectric sidewall 131 completes a hermetic seal around the isolation device 101 consisting of the lower bond pad 122, upper bond pad 132, protective overcoat 134, the $SiO_xN_y$ layer 140, and a scribe seal (not specifically shown) which surrounds the microelectronic device 100.

Figure 1E:
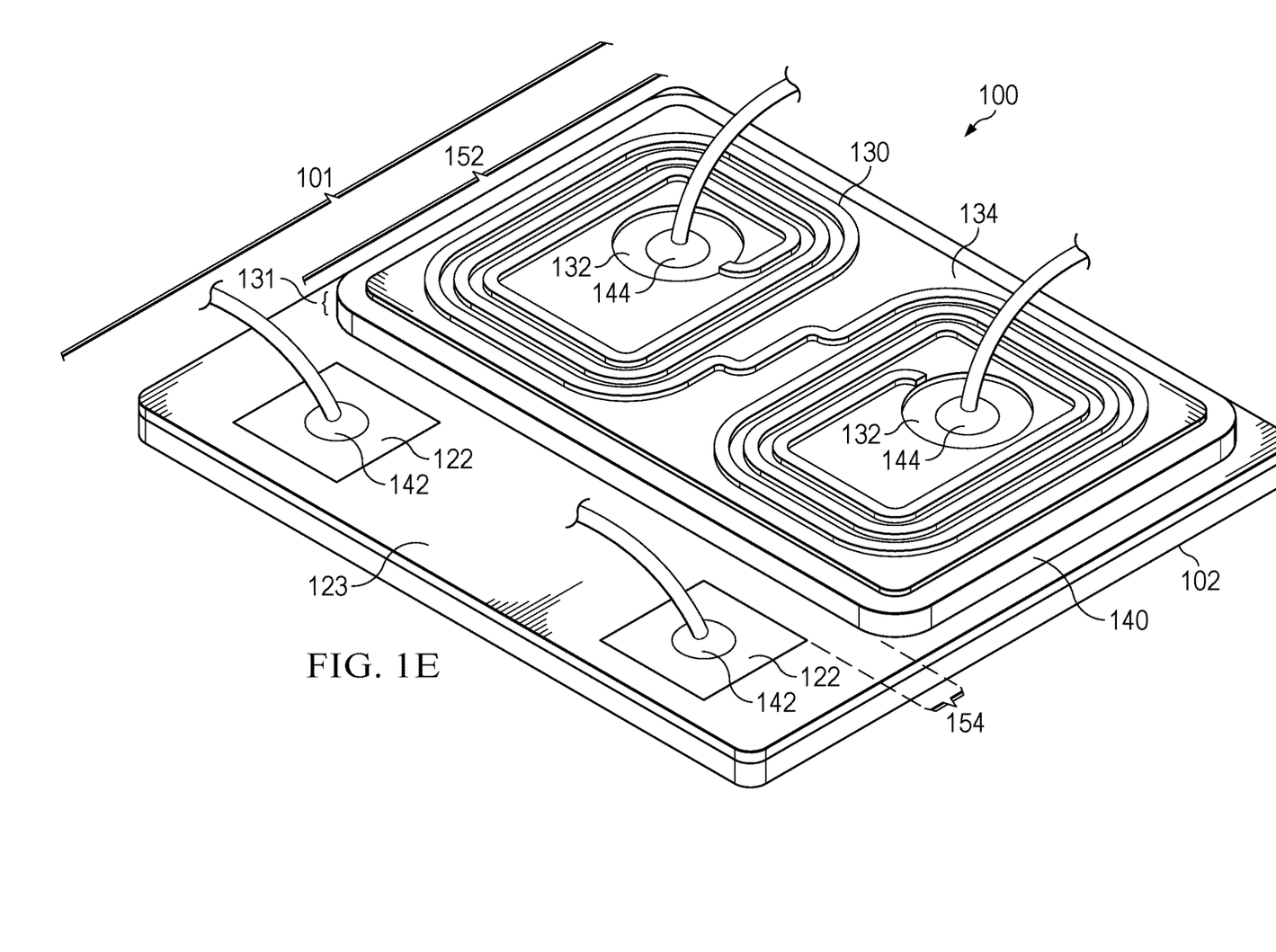
FIG. 1E is a perspective view of an example microelectronic device including an isolation device with a sidewall of $SiO_xN_y$.

FIG. 1E show a perspective view of a microelectronic device 100 with an isolation device 101. It is advantageous for the vertical dielectric sidewall 131 of the plateau 152 to undergo a nitrogen containing plasma 139 treatment (shown in FIG. 1C) which forms a $SiO_xN_y$ layer 140 on the surface of the vertical dielectric sidewall 131 providing passivation of the vertical dielectric sidewall 131 to prevent moisture ingress. Other elements shown in the perspective view include the substrate 102, the lower bond pad 122, the lower ball bond 142, an etch stop layer 123, the plateau to bond pad space 154, the upper bond pad 132, the upper ball bond 144, the upper metal coil 130, and the protective overcoat 134.

Figure 2A:
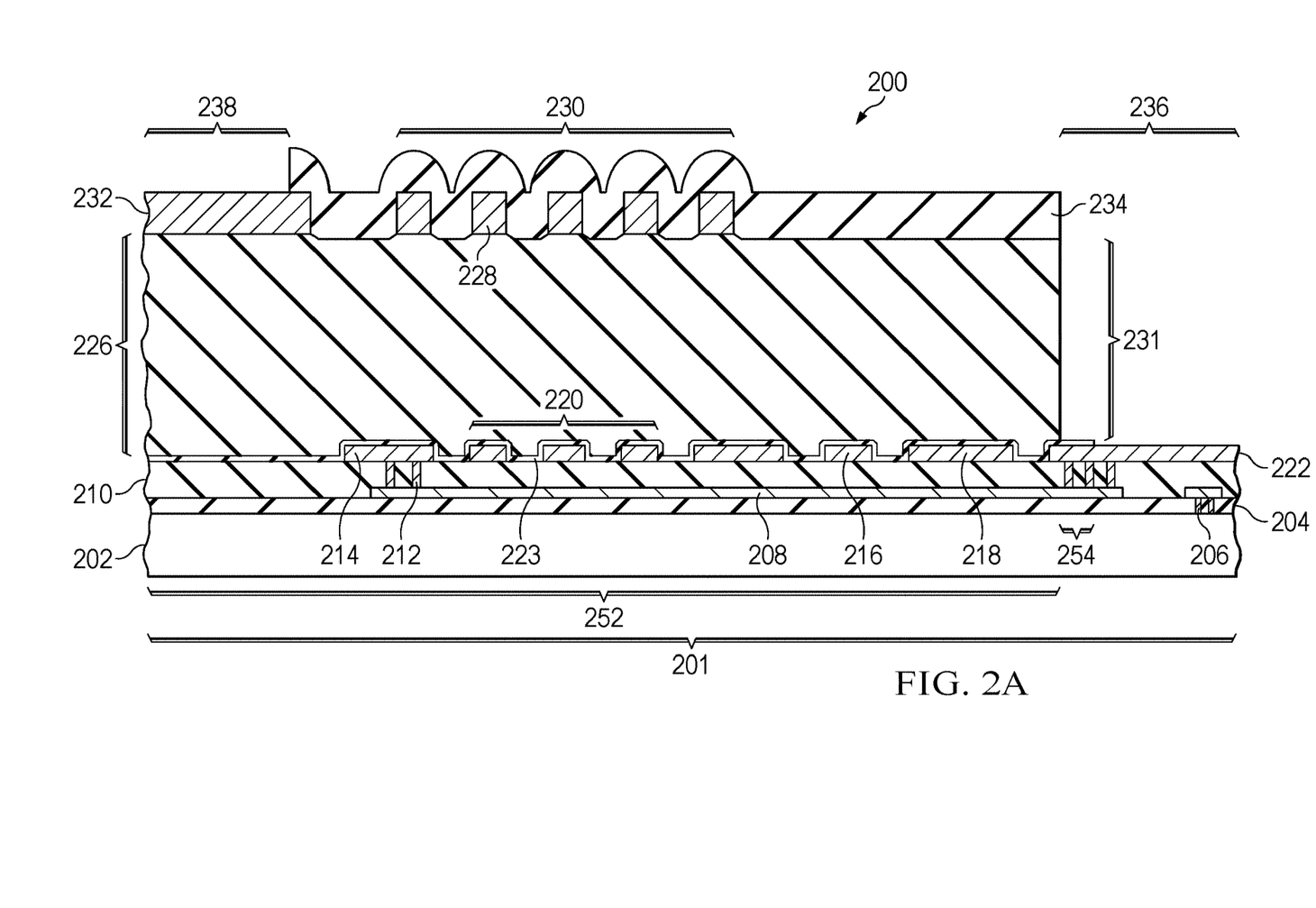
FIG. 2A through FIG. 2B are cross sections of an example microelectronic device with an isolation device containing a sidewall of $SiO_xN_y$ depicted in successive stages of an example method of formation.

FIG. 2A is a cross section of an example microelectronic device 200 including a portion of an isolation device 201 after the formation of the protective overcoat 234 layer and a series of photolithography and etch steps necessary to define a plateau 252 and expose the upper bond pad opening region 238 and the lower bond pad opening region 236. The microelectronic device 200 including the isolation device 201 may be implemented as part of a multi-chip array to provide galvanic isolation between a high voltage component and a low voltage component. The isolation device 201 of this example is a transformer, but could include a capacitor, a magnetic isolator, an optical isolator, a thermal isolator, or other elements which require galvanic isolation between high voltage and low voltage elements. The microelectronic device 200 is formed on a substrate 202, which may be part of a semiconductor wafer and may contain additional microelectronic devices. The substrate 202 includes a semiconductor material. The semiconductor material may include crystalline silicon, or may include another semiconductor material, such as silicon germanium, silicon carbide, gallium nitride, or gallium arsenide, by way of example.

A pre-metal dielectric (PMD) layer 204 is formed on the substrate 202. The PMD layer 204 includes one or more dielectric layers of silicon dioxide, phosphosilicate glass (PSG), fluorosilicate glass (FSG), borophosphosilicate glass (BPSG), organosilicate glass (OSG), low-k dielectric material, silicon nitride, silicon oxynitride, silicon carbide, silicon carbide nitride, or other dielectric materials. The PMD layer 204 may be formed by one or more dielectric deposition processes, such as a low-pressure chemical vapor deposition (LPCVD) process, a plasma enhanced chemical vapor deposition (PECVD) process, a high aspect ratio process (HARP) using ozone and tetraethyl orthosilicate (TEOS), high density plasma deposition (HDP), or an atmospheric pressure chemical vapor deposition (APCVD) process.

Contacts 206 of the first level interconnects 208 are formed through the PMD layer 204 to make electrical connections to the substrate 202. The contacts 206 are electrically conductive, and may include tungsten on a titanium adhesion layer and a titanium nitride liner. The contacts 206 may be formed by etching contact holes through the PMD layer 204, and forming the titanium adhesion layer by a physical vapor deposition (PVD) process. The titanium nitride liner may be formed on the titanium adhesion layer by an atomic layer deposition (ALD) process or chemical vapor deposition (CVD) process. The tungsten may be formed on the titanium nitride liner by a metalorganic chemical vapor deposition (MOCVD) process using tungsten hexafluoride reduced by silane and hydrogen. Tungsten, titanium nitride, and titanium on a top surface of the PMD layer 204, outside of the contacts 206, may be removed by a tungsten etch back process, a tungsten chemical mechanical polish (CMP) process, or both.

By way of example, the metallization of the isolation device 201 is described for an etched aluminum-based interconnect system. The isolation device 201 may also be formed using a copper-based interconnect system. First level interconnects 208 are formed on the PMD layer 204, making electrical connections to the contacts 206. The first level interconnects 208 are electrically conductive. The first level interconnects 208 may have an etched aluminum structure, and may include an adhesion layer, not shown, of titanium nitride or titanium tungsten, on the PMD layer 204, an aluminum layer, not specifically shown, with a few atomic percent of silicon, titanium, or copper, on the adhesion layer, and an anti-reflection layer, not specifically shown, of titanium nitride on the aluminum layer. An etch mask, not specifically shown, is formed followed by a reactive ion etch (RIE) process to etch the anti-reflection layer, the aluminum layer, and the adhesion layer where exposed by the etch mask, and subsequently removing the etch mask to form the first level interconnects 208.

The first interlevel dielectric (ILD) layer 210 is formed on the first level interconnects 208. After the formation of the first ILD layer 210, first level vias 212 are formed in the first ILD layer 210, making electrical connection to the first level interconnects 208. The first level vias 212 may be formed by etching via holes through the first ILD layer 210, and forming a titanium adhesion layer by a physical vapor deposition (PVD) process. A titanium nitride liner may be formed on the titanium adhesion layer by an atomic layer deposition (ALD) process or chemical vapor deposition (CVD) process. Tungsten may be formed on the titanium nitride liner by a metalorganic chemical vapor deposition (MOCVD) process using tungsten hexafluoride reduced by silane and hydrogen. Tungsten, titanium nitride, and titanium on a top surface of the first level vias 212, outside of the via holes may be removed by a tungsten etch back process, a tungsten chemical mechanical polish (CMP) process, or both.

Second level interconnects 214 are formed on the first ILD layer 210 making electrical contact with the first level vias 212. The second level interconnects 214 is electrically conductive. The second level interconnects 214 may have an etched aluminum structure, and may include an adhesion layer, not specifically shown, of titanium nitride or titanium tungsten, on the first ILD layer 210, an aluminum layer, not specifically shown, with a few atomic percent of silicon, titanium, or copper, on the adhesion layer, and an anti-reflection layer, not specifically shown, of titanium nitride on the aluminum layer. A second interconnects etch mask (not specifically shown), is formed followed by a reactive ion etch (RIE) process to etch the anti-reflection layer, the aluminum layer, and the adhesion layer where exposed by the etch mask, and subsequently removing the etch mask to form the second level interconnects 214. In the example shown in FIG. 2A, a lower metal coil 220 of the isolation device 201 may be formed in the second level interconnects 214 but may be formed at other levels. A ground ring 216 (grounding outside of the plane of the cross section of FIG. 2A) for the isolation device 201 is also formed in the second level interconnects 214. Grounded second level interconnects filler metal 218 (grounding outside of the plane of the cross section of FIG. 2A) may also be formed in the second level interconnects). The filler metal 218 may also be floating with respect to ground. A lower bond pad 222 may also be formed in the second level interconnects 214.

A dielectric stack 226 is deposited on the second level interconnects 214 which forms the plateau 252 (shown in FIG. 1E) of the isolation device 201 between the lower metal coil 220 and the upper metal coil 230. The dielectric layers composing the dielectric stack 226 may be a single layer or combination of low stress silicon dioxide, high stress silicon dioxide, and high density plasma (HDP) silicon dioxide. The low stress silicon dioxide may have a stress between −60 MPa and −10 MPa. The high stress silicon dioxide may have a stress between −150 MPa and −80 MPa. The HDP silicon dioxide may have a stress between −120 MPa and −90 MPa. The dielectric stack 226 may also contain an etch stop layer 223 of silicon nitride or silicon oxynitride over the lower metal coil 220 and the lower bond pad 222.

Top metal interconnects 228 are formed on the dielectric stack 226. The top metal interconnects 228 may have an etched aluminum structure, and may include an adhesion layer, not specifically shown, of titanium nitride or titanium tungsten, upper, an aluminum layer, not specifically shown, with a few atomic percent of silicon, titanium, or copper, on the adhesion layer, and an anti-reflection layer, not specifically shown, of titanium nitride on the aluminum layer. A top metal interconnects photolithography mask (not specifically shown) is formed followed by a reactive ion etch (RIE) process to etch the anti-reflection layer, the aluminum layer, and the adhesion layer where exposed by the etch mask. The RIE used to etch the top metal interconnects 228 may remove up to 200 nm of the dielectric stack 226 in areas exposed to the RIE. Features of the top metal interconnects 228 shown include the upper metal coil 230 and the upper bond pad 232. The top metal interconnects 228 may also be formed using a copper-based interconnect system.

A protective overcoat 234 is formed over the top metal interconnects 228. The protective overcoat 234 is formed by a deposition of silicon oxynitride, silicon nitride, or a combination thereof. After a series of photolithography and plasma etch steps (not specifically shown) are used to remove the protective overcoat 234 in the upper bond pad opening region 238 to expose the upper bond pad 232 as well as the protective overcoat 234 and the dielectric stack 226 in the lower bond pad opening region 236 to expose the lower bond pad 222. The etching of the dielectric stack 226 results in a vertical dielectric sidewall 231 of the plateau 252. The vertical dielectric sidewall 231 comprises silicon dioxide. The vertical dielectric sidewall 231 of the silicon dioxide may provide a pathway for moisture ingress into the dielectric stack 226. The absorption of moisture through the dielectric stack 226 may result in cracking of the dielectric stack 226, or degradation of the dielectric stack 226 electrical integrity for the isolation device 201 during operation. If a etch stop layer 223 is present, there may be a plateau to bond pad space 254 of the etch stop layer 223 between the plateau 252 and the edge of the lower bond pad 222 where the etch stop layer 223 has been removed.

Figure 2B:
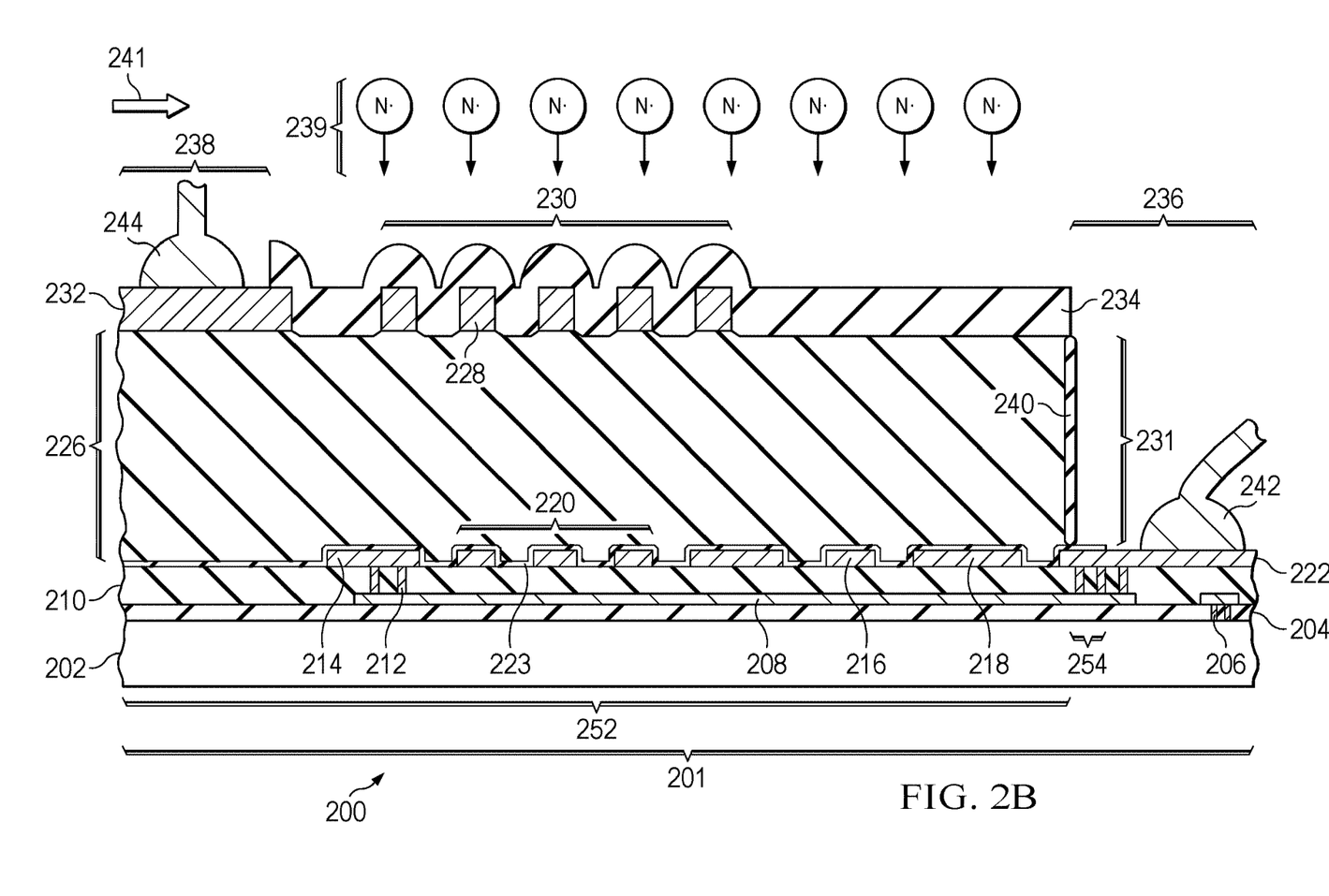

Referring to FIG. 2B, a nitrogen containing plasma 239 is used to form a surface $SiO_xN_y$ layer 240 on the silicon dioxide of the vertical dielectric sidewall 231. The plasma dissociates the nitrogen containing precursor 241 into nitrogen radicals and hydrogen radicals. A typical nitrogen source to produce the nitrogen radicals may be ammonia, but dinitrogen or an organic species with a general formula $C_xH_yN_z$ (where x, y, and z may be from zero to one) may be used. Under wafer appropriate wafer bias conditions, the nitrogen radicals can exchange with oxygen bonded to silicon atoms on or near the surface of the exposed silicon dioxide of the vertical dielectric sidewall 231 forming the $SiO_xN_y$ layer 240. The $SiO_xN_y$ layer 240 may be from 1 nm to greater than 10 nm based on the nitrogen containing plasma 239 formation conditions. The nitrogen containing plasma 239 is a surface treatment in which nitrogen radicals in the nitrogen containing plasma 239 reacts with the silicon dioxide of the vertical dielectric sidewall 131 and is not a CVD deposition. Since the nitrogen containing plasma 239 is surface treatment, and the stoichiometry of resulting $SiO_xN_y$ layer 240 is most nitrogen rich at the surface of the $SiO_xN_y$ layer 240 with the nitrogen concentration of the $SiO_xN_y$ layer 240 becoming lower deeper into the $SiO_xN_y$ layer. The nitrogen containing plasma 239 may be accomplished in an PECVE deposition chamber or plasma etch chamber by way of example. Nitrogen or another inert gas may be used as a carrier gas for the nitrogen containing precursor 241. The wafer temperature may be more than 200 C. The nitrogen containing plasma 239 treatment time may be greater than 10 seconds with a partial pressure of the nitrogen containing precursor 241 greater than 10 percent. The power of the plasma during the nitrogen containing plasma 239 may be greater than 250 watts by way of example.

Additional features shown in FIG. 2B formed after the nitrogen containing plasma 239 include the formation of the upper ball bond 242 to the upper bond pad 232, and the formation of the lower ball bond 244 to the lower bond pad 222. The addition of the $SiO_xN_y$ layer 240 to the vertical dielectric sidewall 231 completes a hermetic seal around the isolation device 201 consisting of the lower bond pad 222, upper bond pad 232, protective overcoat 234, the $SiO_xN_y$ layer 240, and a scribe seal (not specifically shown) which surrounds the microelectronic device 200.

Figure 3A:
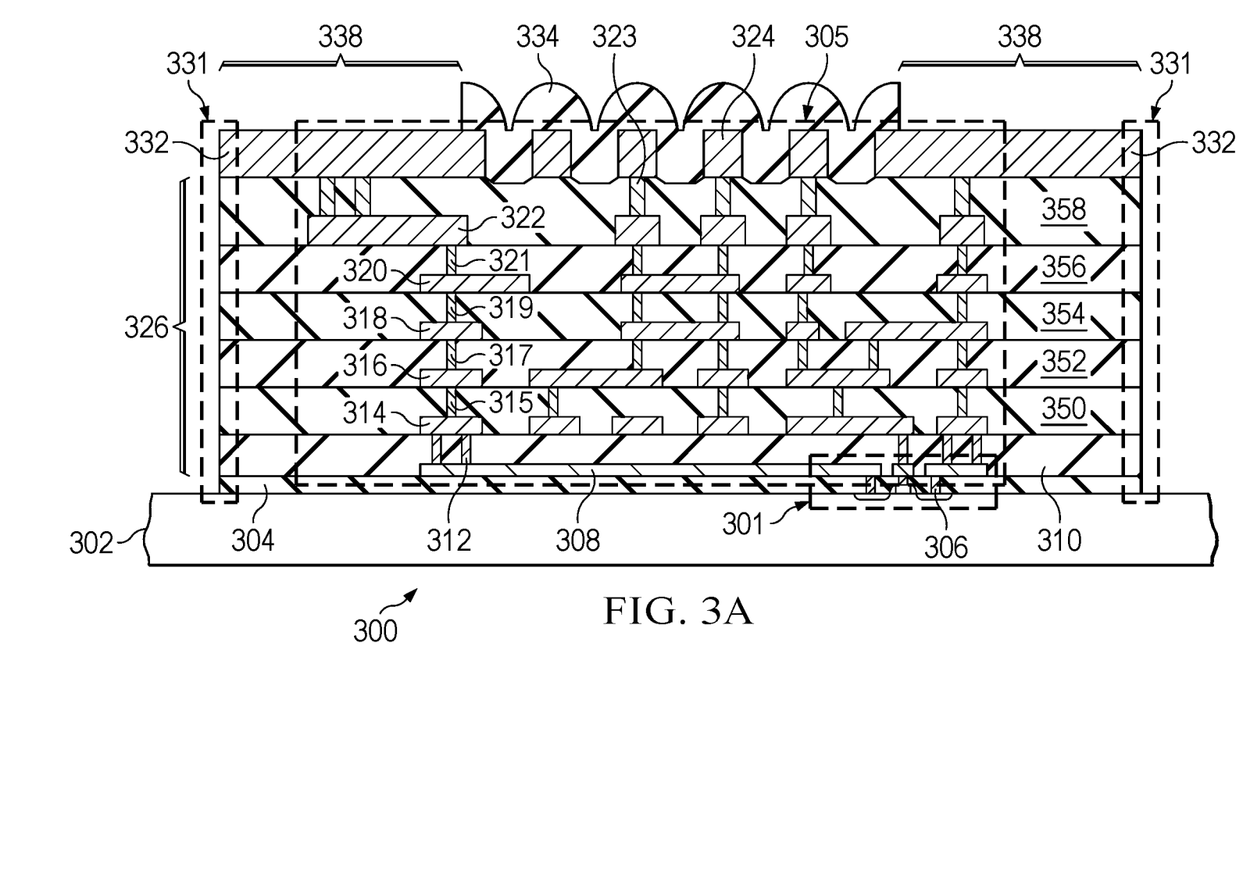
FIG. 3A through FIG. 3B are cross sections of an example microelectronic device with an interconnect system and a sidewall of $SiO_xN_y$, depicted in successive stages of an example method of formation.

FIG. 3A is a cross section of an example microelectronic device 300 containing a microelectronic component 301 after the formation of the protective overcoat 334 layer and a series of photolithography and etch steps necessary to define and expose bond pad opening regions 338. The microelectronic component 301 in FIG. 3A is a complementary metal oxide semiconductor (CMOS), but could be a laterally diffused metal oxide semiconductor (LDMOS) transistor, a drain extended metal oxide semiconductor (DEMOS) transistor, a bipolar junction transistor, a junction field effect transistor, a gated bipolar, a gated unipolar semiconductor device, an insulated gate bipolar transistor (IGBT), a silicon controlled rectifier (SCR), a metal oxide semiconductor (MOS)-triggered SCR, a MOS-controlled thyristor, a gated diode, or a Schottky diode by way of example. The microelectronic device 300 is formed on a substrate 302, which may be part of a semiconductor wafer and may contain additional microelectronic devices. The substrate 302 includes a semiconductor material. The semiconductor material may include crystalline silicon, or may include another semiconductor material, such as silicon germanium, silicon carbide, gallium nitride, or gallium arsenide, by way of example. The microelectronic component 301 is formed in the substrate 302.

A pre-metal dielectric (PMD) layer 304 is formed on the substrate 302. The PMD layer 304 includes one or more dielectric layers of silicon dioxide, phosphosilicate glass (PSG), fluorosilicate glass (FSG), borophosphosilicate glass (BPSG), organosilicate glass (OSG), low-k dielectric material, silicon nitride, silicon oxynitride, silicon carbide, silicon carbide nitride, or other dielectric materials. The PMD layer 304 may be formed by one or more dielectric deposition processes, such as a low-pressure chemical vapor deposition (LPCVD) process, a plasma enhanced chemical vapor deposition (PECVD) process, a high aspect ratio process (HARP) using ozone and tetraethyl orthosilicate (TEOS), high density plasma deposition (HDP), or an atmospheric pressure chemical vapor deposition (APCVD) process.

Contacts 306 to the first level interconnects 308 are formed through the PMD layer 304 to make electrical connections to the microelectronic component 301. The contacts 306 are electrically conductive, and may include tungsten on a titanium adhesion layer and a titanium nitride liner. The contacts 306 may be formed by etching contact holes through the PMD layer 304, and forming the titanium adhesion layer by a physical vapor deposition (PVD) process. The titanium nitride liner may be formed on the titanium adhesion layer by an atomic layer deposition (ALD) process or chemical vapor deposition (CVD) process. The tungsten may be formed on the titanium nitride liner by a metalorganic chemical vapor deposition (MOCVD) process using tungsten hexafluoride reduced by silane and hydrogen. Tungsten, titanium nitride, and titanium on a top surface of the PMD layer 304, outside of the contacts 306, may be removed by a tungsten etch back process, a tungsten chemical mechanical polish (CMP) process, or both.

The interconnect system 305 of the microelectronic device 300 consists of an electrically conducting material. In FIG. 3A, the interconnect system 305 is described for an etched aluminum-based interconnect system. The interconnect system 305 may also be formed using a copper-based interconnect system. First level interconnects 308 are formed on the PMD layer 304, making electrical connections to the contacts 306. The first level interconnects 308 are electrically conductive. The first level interconnects 308 may have an etched aluminum structure, and may include an adhesion layer, not shown, of titanium nitride or titanium tungsten, on the PMD layer 304, an aluminum layer, not specifically shown, with a few atomic percent of silicon, titanium, or copper, on the adhesion layer, and an anti-reflection layer, not specifically shown, of titanium nitride on the aluminum layer. An etch mask, not specifically shown, is formed followed by a reactive ion etch (RIE) process to etch the anti-reflection layer, the aluminum layer, and the adhesion layer where exposed by the etch mask, and subsequently removing the etch mask to form the first level interconnects 308.

The first interlevel dielectric (ILD) layer 310 is formed on the first level interconnects 308. After the formation of the first ILD layer 310, first level vias 312 are formed in the first ILD layer 310, making electrical connection to the first level interconnects 308. The first level vias 312 may be formed by etching via holes through the first ILD layer 310, and forming a titanium adhesion layer by a physical vapor deposition (PVD) process. A titanium nitride liner may be formed on the titanium adhesion layer by an atomic layer deposition (ALD) process or chemical vapor deposition (CVD) process. Tungsten may be formed on the titanium nitride liner by a metalorganic chemical vapor deposition (MOCVD) process using tungsten hexafluoride reduced by silane and hydrogen. Tungsten, titanium nitride, and titanium on a top surface of the first level vias 212, outside of the via holes may be removed by a tungsten etch back process, a tungsten chemical mechanical polish (CMP) process, or both.

Second level interconnects 314 are formed on the first ILD layer 310 making electrical contact with the first level vias 312. The second level interconnects 314 is electrically conductive. The second level interconnects 314 may have an etched aluminum structure, and may include an adhesion layer, not specifically shown, of titanium nitride or titanium tungsten, on the first ILD layer 310, an aluminum layer, not specifically shown, with a few atomic percent of silicon, titanium, or copper, on the adhesion layer, and an anti-reflection layer, not specifically shown, of titanium nitride on the aluminum layer. A second interconnects etch mask (not specifically shown), is formed followed by a reactive ion etch (RIE) process to etch the anti-reflection layer, the aluminum layer, and the adhesion layer where exposed by the etch mask, and subsequently removing the etch mask to form the second level interconnects 314.

In a similar manner to the formation of the first level interconnects 308, first ILD layer 310, first level vias 312, and second level interconnects 314, the remaining levels of the interconnect system 305 shown in FIG. 3A may be formed. The remaining components of the interconnect system 305 include third level interconnects 316, fourth level interconnects 318, fifth level interconnects 320, sixth level interconnects 322, seventh level interconnects 324, second level vias 315, third level vias 317, fourth level vias 319, fifth level vias 321, sixth level vias 323, second ILD 350, third ILD 352, fourth ILD 354, fifth ILD 356, and sixth ILD 358. The dielectric layers composing the dielectric stack 326 may be any combination of low stress silicon dioxide, high stress silicon dioxide, high density plasma (HDP) silicon dioxide. The low stress silicon dioxide may have a stress between −60 MPa and −10 MPa. The high stress silicon dioxide may have a stress between −150 MPa and −80 MPa. The HDP silicon dioxide may have a stress between −120 MPa and −90 MPa.

A protective overcoat 334 is formed over the interconnect system 305. The protective overcoat 334 is formed by a deposition of silicon oxynitride, silicon nitride, or a combination thereof. After a series of photolithography and plasma etch steps (not specifically shown) is used to remove the protective overcoat 334 in the bond pad opening regions 338 to expose the bond pads 332. Additional photolithography and etch steps may etch the dielectric stack outside of the interconnect system to expose the substrate 302. The etching of the dielectric stack 326 results in a vertical dielectric sidewall 331 around the interconnect system 305. The vertical dielectric sidewall 331 is comprised essentially of silicon dioxide. The vertical dielectric sidewall 331 of silicon dioxide may provide a pathway for moisture ingress into the dielectric stack 326. The absorption of moisture through the dielectric stack 326 may result in cracking of the dielectric stack 326, or degradation of the electrical properties of the dielectric stack 326 during operation of the microelectronic device 300.

Figure 3B:
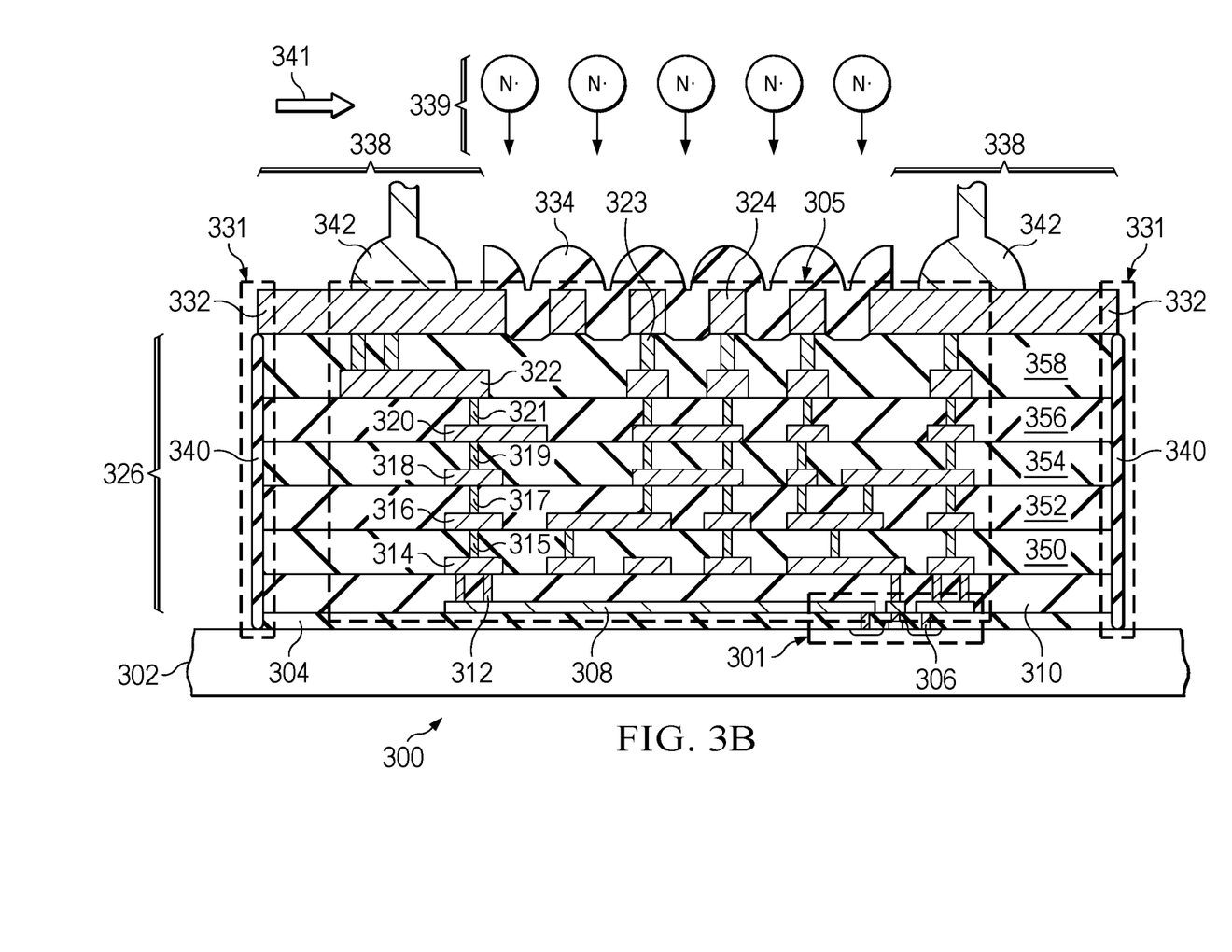

Referring to FIG. 3B, a nitrogen containing plasma 339 is used to form a surface $SiO_xN_y$ layer 340 on the silicon dioxide of the vertical dielectric sidewall 331. The plasma dissociates the nitrogen containing precursor 341 into hydrogen radicals and hydrogen radicals. A typical nitrogen containing precursor 341 to produce the nitrogen radicals may be ammonia, dinitrogen or an organic species with a general formula $C_xH_yN_z$ (where x, y, and z may range from zero to one) may be used. Under wafer appropriate wafer bias conditions, the nitrogen radicals can exchange with oxygen bonded to silicon atoms near the surface of the exposed vertical dielectric sidewall 331 forming a $SiO_xN_y$ layer 340. The $SiO_xN_y$ layer 340 may be from 1 nm to greater than 10 nm based on the nitrogen containing plasma 339 formation conditions. The nitrogen containing plasma 339 is a surface treatment in which nitrogen radicals in the nitrogen containing plasma 339 react with the silicon dioxide of the vertical dielectric sidewall 331 and is not a CVD deposition. As the nitrogen containing plasma 339 is a surface treatment, the stoichiometry of resulting $SiO_xN_y$ layer 340 is most nitrogen rich at the surface of the $SiO_xN_y$ layer 340 with the atomic nitrogen concentration of the $SiO_xN_y$ layer 340 becoming lower deeper into the $SiO_xN_y$ layer 340. The nitrogen containing plasma 339 may be accomplished in an PECVE deposition chamber or plasma etch chamber by way of example. Nitrogen or another inert gas may be used as a carrier gas for the nitrogen containing precursor 341. The wafer temperature may be more than 200 C. The nitrogen containing plasma 339 treatment time may be greater than 10 seconds with a partial pressure of the nitrogen containing precursor 341 greater than 10 percent. The power of the plasma during the nitrogen containing plasma 339 may be greater than 250 watts by way of example.

Additional features shown in FIG. 3B formed after the nitrogen containing plasma 339 include the formation of the ball bonds 342 to the bond pads 332, The addition of the $SiO_xN_y$ layer 340 to the vertical dielectric sidewall 331 completes a hermetic seal around the microelectronic component 301 and interconnect system 305 consisting of the $SiO_xN_y$ layer 340, the bond pads 332, and the protective overcoat 234.

Figure 4:
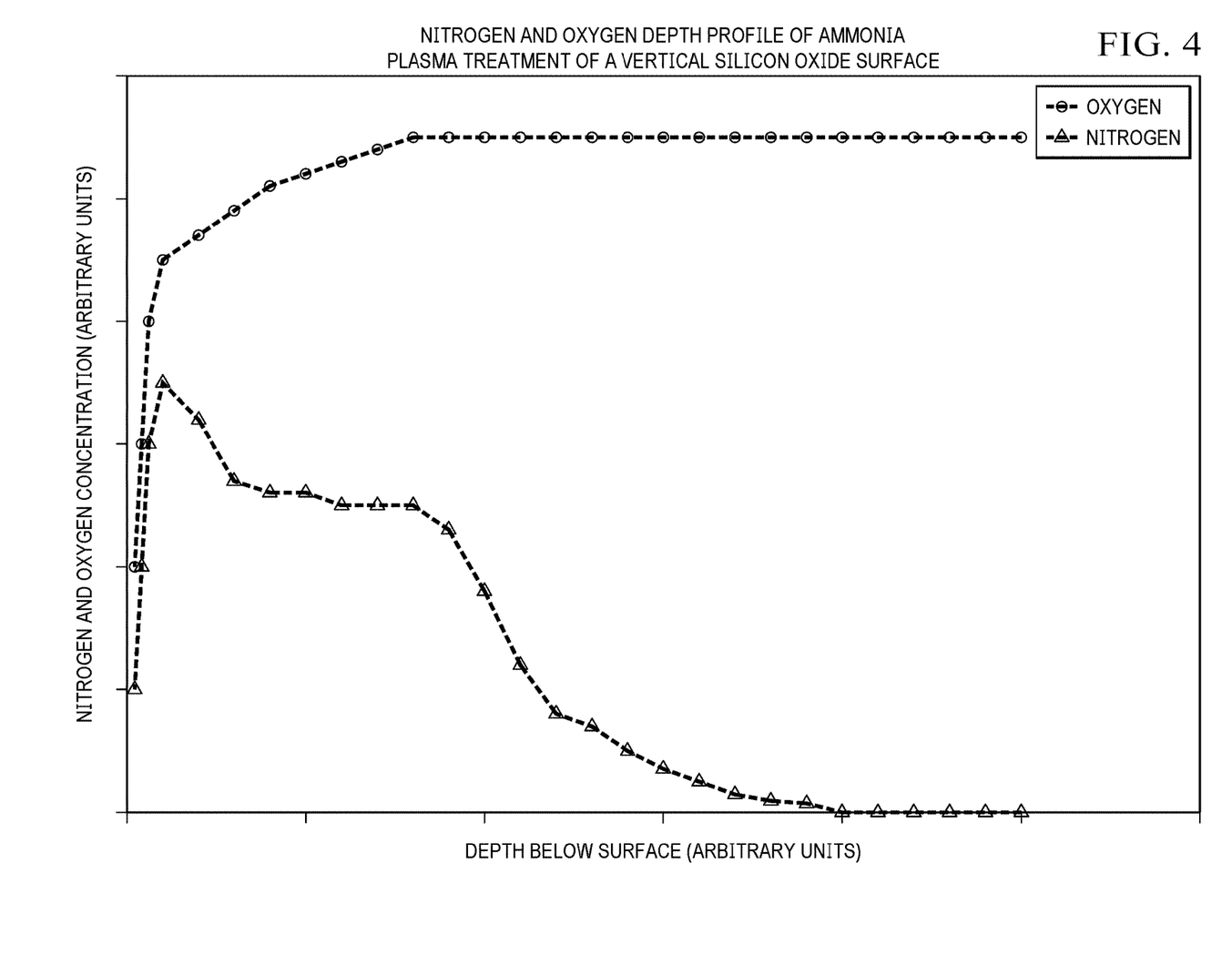
FIG. 4 is a graph showing a simulated depth profile of nitrogen and oxygen for a silicon dioxide film after treatment with a nitrogen containing plasma.

Referring to FIG. 4, a graph is shown of a Time of Flight-Secondary Ion Mass Spectroscopy simulation of the nitrogen and oxygen concentration at increasing depth from the surface of the $SiO_xN_y$ layer 140 on the vertical dielectric sidewall 131 discussed in FIG. 1C. The nitrogen concentration is highest near the surface of the $SiO_xN_y$ layer 140 and decreases, as the depth from the surface of the $SiO_xN_y$ layer 140 is increased. The presence of nitrogen at the surface of the vertical dielectric sidewall 131 is indicative of a $SiO_xN_y$ layer 140 which is nitrogen rich and provides a barrier to moisture ingress from the ambient environment into the isolation device 101 through the vertical dielectric sidewall 131.

Figure 5:
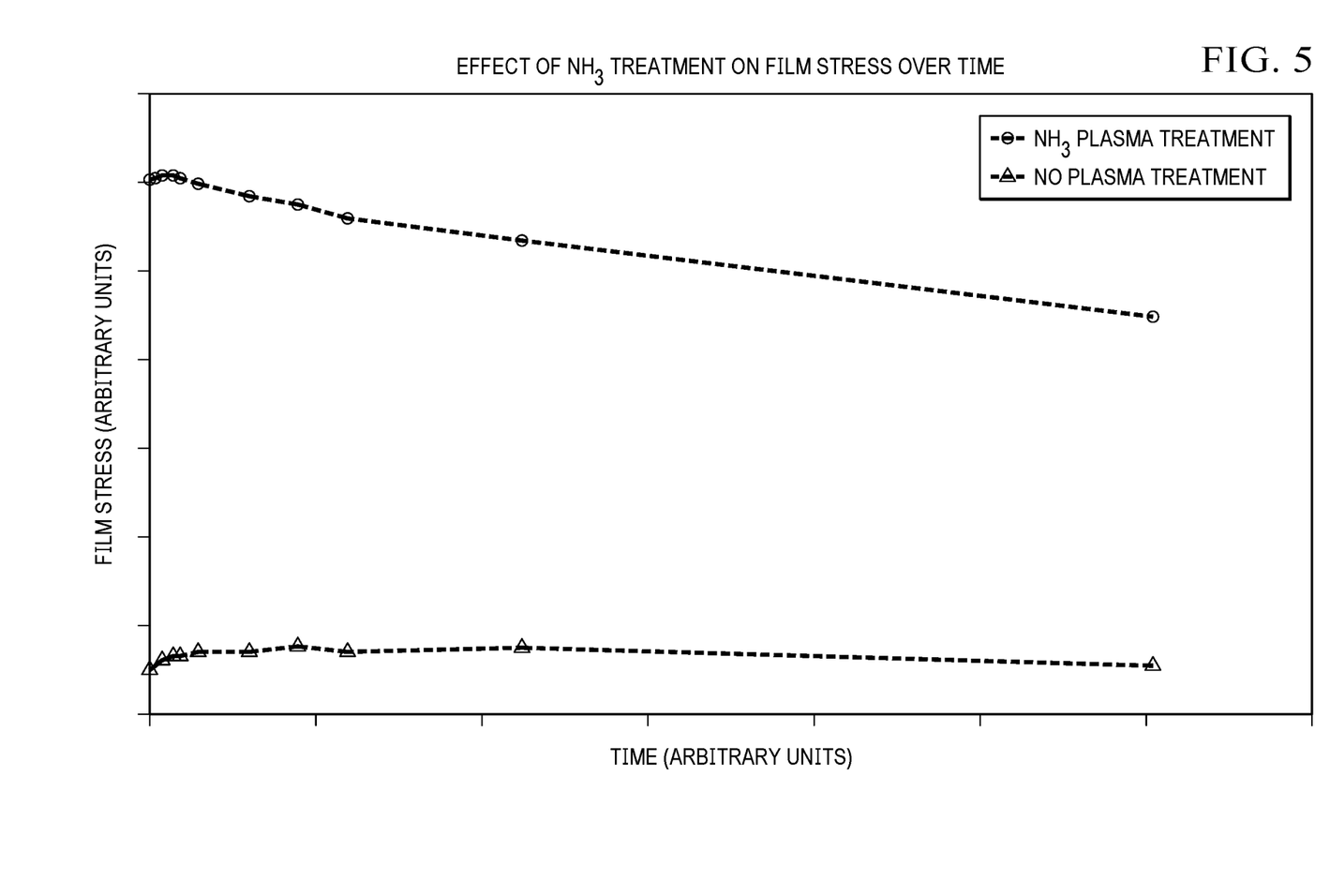
FIG. 5 is a graph showing the change in stress over time for a silicon dioxide film with a nitrogen containing plasma treatment and for a silicon dioxide film without a nitrogen containing plasma treatment.

FIG. 5 is a graph comparing the change in film stress over time for a silicon dioxide film on a silicon wafer for a wafer that has not be treated with a nitrogen containing plasma 139 as shown in FIG. 1C compared to a silicon dioxide film on a silicon wafer for a wafer that has been treated with a nitrogen containing plasma 139. Changes in wafer stress over time for silicon dioxide films can be a good indicator of ingress of moisture into the films. In the graph shown in FIG. 5, the untreated silicon dioxide film stress changed approximately 40% over the time period studied, while the change in film stress for a wafer treated with a nitrogen containing plasma 139 was less than 5%. The low change in film stress for the nitrogen containing plasma 139 treated film is evidence of the formation of a $SiO_xN_y$ film at the wafer surface which is a good barrier to moisture ingress into the underlying silicon dioxide film.

What is claimed is:

1. A microelectronic device, comprising:
   a substrate;
   a pre-metal dielectric layer on the substrate; and
   an isolation device including;
      a plateau on the pre-metal dielectric layer, the plateau including;
         a lower isolation element;
         a dielectric stack on the lower isolation element;
         an upper isolation element on the dielectric stack; and
         a $SiO_xN_y$ layer on a vertical dielectric sidewall of the dielectric stack, the $SiO_xN_y$ layer containing more than 5 atomic percent nitrogen;
      an upper bond pad in electrical contact with the upper isolation element; and
      a lower bond pad in electrical contact with the lower isolation element.

2. The microelectronic device of claim 1, wherein the $SiO_xN_y$ layer contains silicon nitride.

3. The microelectronic device of claim 1, wherein the $SiO_xN_y$ layer contains silicon oxynitride.

4. The microelectronic device of claim 1, wherein the dielectric stack contains one or more layers of silicon nitride.

5. The microelectronic device of claim 4, wherein the $SiO_xN_x$ layer does not extend on a sidewall of the one or more layers of silicon nitride.

6. The microelectronic device of claim 1, wherein the dielectric stack contains one or more layers of silicon oxynitride.

7. The microelectronic device of claim 6, wherein the $SiO_xN_x$ layer does not extend on a sidewall of the one or more layers of silicon oxynitride.

8. The microelectronic device of claim 1, wherein the dielectric stack contains one or more layers of low stress silicon dioxide.

9. The microelectronic device of claim 1, wherein the dielectric stack contains one or more layers of high stress silicon dioxide.

10. A microelectronic device, comprising:
    a substrate;
    a microelectronic component in the substrate;
    a pre-metal dielectric layer on the substrate;

contacts to the microelectronic component in the substrate through the pre-metal dielectric layer;

an interconnect system on the pre-metal dielectric layer including:
- a metal stack containing one or more layers of an electrically conducting material;
- a dielectric stack with a dielectric layer between each layer of the electrically conducting material;
- one or more levels of vias connecting the one or more layers of the electrically conducting material through the dielectric layer; and
- a $SiO_xN_y$ layer on a vertical dielectric sidewall of the dielectric stack, the $SiO_xN_y$ layer containing more than 5 atomic percent nitrogen;

a dielectric protective overcoat on the interconnect system; and one or more bond pads in electrical contact with the interconnect system.

11. The microelectronic device of claim 10, wherein the microelectronic component is a complementary metal oxide semiconductor (CMOS) transistor, a laterally diffused metal oxide semiconductor (LDMOS) transistor, a drain extended metal oxide semiconductor (DEMOS) transistor, a bipolar junction transistor, a junction field effect transistor, a gated bipolar semiconductor device, a gated unipolar semiconductor device, an insulated gate bipolar transistor (IGBT), a silicon controlled rectifier (SCR), a metal oxide semiconductor (MOS)-triggered SCR, a MOS-controlled thyristor, a gated diode, or a Schottky diode.

12. The microelectronic device of claim 10, wherein the dielectric stack contains one or more layers of silicon dioxide.

13. A method of forming a microelectronic device, comprising:

forming an isolation device including:
    forming a pre-metal dielectric layer;
    forming a plateau including:
- forming a lower isolation element on the pre-metal dielectric layer;
- forming a dielectric stack on the lower isolation element;
- forming an upper isolation element on the dielectric stack; and
- forming a $SiO_xN_y$ layer on a vertical dielectric sidewall of the dielectric stack, the $SiO_xN_y$ layer containing more than 5 atomic percent nitrogen;

forming an upper bond pad in electrical contact with upper isolation element; and forming a lower bond pad in electrical contact with the lower isolation element.

14. The method of claim 13, wherein the $SiO_xN_y$ layer is formed in an ammonia plasma.

15. The method of claim 13, wherein the $SiO_xN_y$ layer is formed in a nitrogen plasma.

16. The method of claim 13, wherein the $SiO_xN_y$ layer is formed in a $C_xH_yN_z$ plasma.

17. The method of claim 13, wherein the dielectric stack contains one or more layers of silicon nitride and the $SiO_xN_y$ layer does not extend on a sidewall of the one or more layers of silicon nitride.

18. The method of claim 13, wherein the dielectric stack contains one or more layers on silicon oxynitride and the $SiO_xN_y$ layer does not extend on a sidewall of the one or more layers of silicon oxynitride.

19. The method of claim 13, wherein the dielectric stack contains one or more layers of low stress silicon dioxide.

20. The method of claim 13, wherein the dielectric stack contains one or more layers of high stress silicon dioxide.

\* \* \* \* \*